US008803279B2

(12) United States Patent
Qian (10) Patent No.: US 8,803,279 B2
(45) Date of Patent: Aug. 12, 2014

(54) STRUCTURE FOR PICKING UP A COLLECTOR AND MANUFACTURING METHOD THEREOF (71) Applicant: Shanghai Hua Hong NEC Electronics Co., Ltd, Shanghai (CN)

(72) Inventor: Wensheng Qian, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/899,040

(22) Filed: May 21, 2013

(65) Prior Publication Data

US 2013/0313677 A1 Nov. 28, 2013

(30) Foreign Application Priority Data

May 23, 2012 (CN) .......................... 2012 1 0163784

(51) Int. Cl.
*H01L 21/70* (2006.01)
(52) U.S. Cl.
USPC ......................................................... 257/499
(58) Field of Classification Search
USPC ................... 257/20, 192, 194, 285, 257/E29.246–E29.253, E21.403, E21.407, 257/E21.395, E21.399, E21.334–E21.346, 257/E21.409–E21.449, E21.473, E27.015, 257/E27.017, E27.109, E29.194–E29.225, 257/E27.03–E27.032, E21.382–E21.385, 257/E21.695–E21.696, E27.019–E27.023, 257/E27.037–E27.043, E27.053–E27.058, 257/E27.074–E27.078, E27.106, E27.149, 257/E29.03–E29.045, E29.144, E29.124, 257/E21.372, E21.38–E21.381, 257/E21.608–E21.613, E21.369–E21.393, 257/E29.02–E29.028, E29.066–E29.067, 257/E29.194–E29.202, E21.382–E21.385, 257/E21.608–E21.603, 310–311, 374, 389, 257/410, 411, 506–508, 510, 520, 524, 257/632–651, 671, 701–703; 438/167, 172, 438/135, 151, 197, 199, 201, 216, 48–98, 438/202–208, 234–239, 170, 189, 309–378, 438/38, 211, 225, 240, 257, 261, 263, 264, 438/287, 294–307, 765–794, 967, 981, 242, 438/268–274, 218, 221–224, 400–454; 257/752, 760, 118, 244, 328–333, 466, 257/513, 594, E29.036–E29.038, 257/E29.046–E29.048, E29.115, 257/E21.388–E21.393, E27.052, E27.079, 257/E29.036–E29.038, E29.046–E29.048, 257/E29.151, E29.196, E29.211–E29.225, 257/E21.388–E21.393, E21.614, E21.677, 257/E21.094, E21.104, E21.121, E21.372, 257/E21.411–E21.416, E21.371, E21.387, 257/E21.403–E21.407, E21.445, 257/E21.448–E21.452, E29.315, 552–562, 257/E29.033
See application file for complete search history.

(56) References Cited

U.S. PATENT DOCUMENTS

| 6,396,107 | B1* | 5/2002 | Brennan et al. | 257/362 |
|---|---|---|---|---|
| 8,035,190 | B2* | 10/2011 | Liu et al. | 257/510 |
| 8,421,185 | B2* | 4/2013 | Chiu et al. | 257/526 |
| 2004/0212034 | A1 | 10/2004 | Mochizuki et al. | |
| 2005/0082571 | A1* | 4/2005 | Ohnishi et al. | 257/198 |
| 2006/0226446 | A1* | 10/2006 | Ohnishi et al. | 257/197 |
| 2008/0173940 | A1* | 7/2008 | Miller et al. | 257/339 |
| 2008/0251846 | A1* | 10/2008 | Voldman | 257/355 |
| 2009/0321880 | A1* | 12/2009 | Aoki | 257/591 |
| 2010/0171148 | A1* | 7/2010 | Liu et al. | 257/133 |
| 2011/0140233 | A1 | 6/2011 | Qian et al. | |
| 2011/0156202 | A1* | 6/2011 | Chiu et al. | 257/526 |
| 2012/0056247 | A1* | 3/2012 | Liu et al. | 257/197 |
| 2013/0126945 | A1 | 5/2013 | Liu et al. | |
| 2013/0288447 | A1* | 10/2013 | Cai et al. | 438/311 |

* cited by examiner

*Primary Examiner* — Dao H Nguyen
*Assistant Examiner* — Tram H Nguyen
(74) *Attorney, Agent, or Firm* — MKG, LLC (57) ABSTRACT

A structure for picking up a collector region is disclosed. The structure includes a pair of polysilicon stacks formed in the isolation regions and extending below the collector region; and a pair of collector electrodes contacting on the polysilicon stacks, wherein the pair of polysilicon stacks includes: a first polysilicon layer located below the isolation regions, and a second polysilicon layer located on and in contact with the first polysilicon layer, the first polysilicon layer being doped with a dopant having a higher diffusivity or higher concentration than a dopant of the second polysilicon layer, wherein a depth of the polysilicon stacks is greater than a depth of the collector region; the depth of the collector region is greater than a depth of the second polysilicon layer; and the depth of the second polysilicon layer is greater than a depth of the isolation regions.

15 Claims, 7 Drawing Sheets

FIG.1

Prior Art

STRUCTURE FOR PICKING UP A COLLECTOR AND MANUFACTURING METHOD THEREOF

CROSS-REFERENCES TO RELATED APPLICATIONS

This application claims the priority of Chinese patent application number 201210163784.0, filed on May 23, 2012, the entire contents of which are incorporated herein by reference.

TECHNICAL FIELD

This disclosure pertains generally to a structure for picking up a collector region, and in particular, to a structure for picking up a collector region of a heterojunction bipolar transistor (HBT). The disclosure also relates to a method for manufacturing the structure for picking up a collector region.

BACKGROUND

Silicon-germanium (SiGe) is a semiconductor compound consisting of covalently bonded silicon and germanium atoms. It is a substitution solid solution of the two elements that can infinitely dissolve into each other. SiGe heterojunction bipolar transistors (HBTs) manufactured by using SiGe materials have become a kind of commonly used radio frequency (RF) devices.

Figure 1:
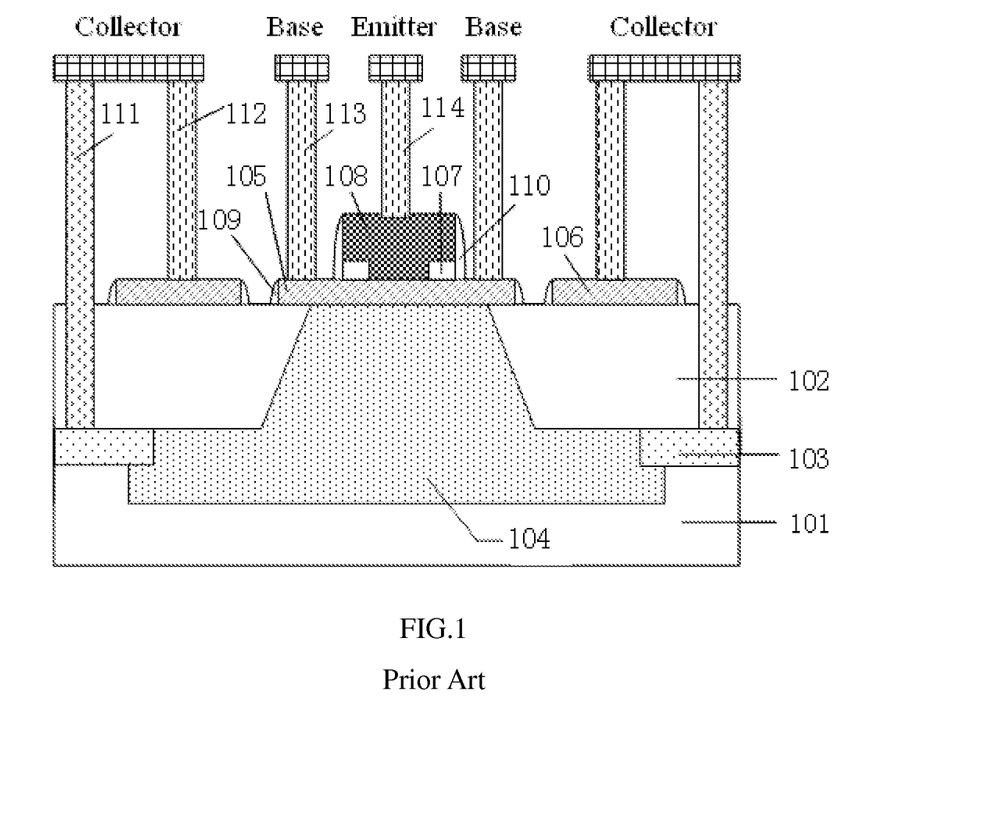
FIG. 1 is a schematic illustration of a vertical cross section of an ultra-high voltage SiGe HBT of the conventional structure.

Chinese patent application Number 201110370460.X, entitled "Ultra-high Voltage SiGe HBT and Manufacturing Method Thereof", filed on Nov. 21, 2011, claims an ultra-high voltage SiGe HBT, as schematically illustrated in FIG. 1.

In a substrate 101, there are formed two isolation structures 102, two pseudo buried layers 103 and a collector region 104. The isolation structures 102 are formed by etching the substrate 101 to form trenches therein and filling a dielectric material into the trenches. The pseudo buried layers 103 are two doped regions each formed under a corresponding isolation structure 102. The pseudo buried layers 103 are formed by implanting ions into the bottoms of the trenches with a high dose and a low energy, and characterized in a shallow junction and a high dopant concentration. The collector region 104 is a doped region located between the two isolation structures 102 and between the two pseudo buried layers 103 as well. It is formed by implanting ions into a portion of the substrate 101 that is sandwiched between the isolation structures 102. Additionally, the collector region 104 has a depth greater than that of the isolation structure 102 and is in contact with the pseudo buried layer 103 on each side of it. A SiGe base region 105 is formed on the collector region 104. The SiGe base region 105 has its two ends above the respective isolation structures 102 that are adjacent to the collector region 104 or has its two ends both situated above the collector region 104. A SiGe field plate 106 is formed on each of the isolation structures 102, and is located right above a border of the collector region 104 and a corresponding one of the pseudo buried layers 103. Moreover, both the SiGe base region 105 and the SiGe field plates 106 are formed by growing a SiGe epitaxial layer and etching it. Dielectric layers 107 and a polysilicon emitter region 108 are formed above the SiGe base region 105. The polysilicon emitter region 108 has a T-shaped vertical cross section (i.e., broader at the top and narrower at the bottom) and is in contact with the SiGe base region 105 at the bottom. The dielectric layers 107 are formed between the SiGe base region 105 and extending portions of the polysilicon emitter region 108. Each side face of the SiGe base region 105 and each side face of each SiGe field plate 106 is covered with a first sidewall 109. In addition, each side face of the polysilicon emitter region 108 is covered with a second sidewall 110. A first electrode 111 is formed through an interlayer dielectric (ILD) layer as well as a corresponding isolation structure 102 and is in contact with a corresponding one of the pseudo buried layers 103. Moreover, second electrodes 112, third electrodes 113 and a fourth electrode 114 are formed through the ILD layer and are in contact with a corresponding one of the SiGe field plates 106, the SiGe base region 105 and the polysilicon emitter region 108. Furthermore, each first electrode 111 is interconnected with a corresponding second electrode 112, and they jointly serve as a collector. Each third electrode 113 serves as a base, and the fourth electrode 114 serves as an emitter.

In this ultra-high voltage SiGe HBT, each pair of a pseudo buried layer 103 and a corresponding first electrode 111 serves as a structure for picking up the collector region. A base-collector (BC) junction (i.e., the PN junction between the SiGe base region 105 and the collector region 104) is characterized in a two-dimensional potential distribution. That is, the BC junction has not only a vertical extension in the downward direction from the SiGe base region 105 to the substrate 101, but also horizontal extensions in the lateral directions from the SiGe base region 105 to the respective pseudo buried layers 103. This feature improves the breakdown voltage in common-emitter configuration, Bvceo, of the device up to 5 volts to 20 volts. For this reason, the device is referred to as an "ultra-high voltage" SiGe HBT device.

Nevertheless, this device has a drawback that, as the two heavily-doped pseudo buried layers 103 are separated from each other by a rather great distance, the lightly-doped collector region 104 that is connected to both the pseudo buried layers will accordingly have a great width. With a determined doping concentration of the collector region 104, the great width typically leads to a high series resistance of the collector region 104 and a great saturation voltage drop of the device. Therefore, the device has a small linear region which limits its applications. On the other hand, although lowering the dopant concentration of the collector region 104 can lead to reduction of the series resistance as well as the saturation voltage drop, it will also lead to reduction of the device's breakdown voltage.

SUMMARY OF THE INVENTION

The present invention overcomes the aforementioned drawback of the conventional structure by presenting a novel structure for picking up a collector region of a heterojunction bipolar transistor (HBT). The structure is capable of not only maintaining a high breakdown voltage in common-emitter configuration Bvceo, but also reducing a saturation voltage drop of the device. In addition, the present also provides a method of manufacturing the structure for picking up a collector region of a HBT.

A first aspect of the present invention provides a structure for picking up a collector region that is formed in a substrate and sandwiched between two isolation regions, the structure including: a pair of polysilicon stacks formed in the isolation regions and extending below the collector region; and a pair of collector electrodes contacting on the polysilicon stacks, wherein the pair of polysilicon stacks comprising: a first polysilicon layer located below the isolation regions, the first polysilicon layer having a first side face contacting with the collector region, an angle between the first side face and a bottom surface of the first polysilicon layer being smaller than 90 degrees; and a second polysilicon layer located on and in contact with the first polysilicon layer, wherein both the first and second polysilicon layers have an opposite conductivity type to a conductivity type of the substrate, wherein the first polysilicon layer is doped with a dopant having a higher diffusivity or higher concentration than a dopant of the second polysilicon layer, and wherein a depth of the polysilicon stacks is greater than a depth of the collector region; the depth of the collector region is greater than a depth of the second polysilicon layer; and the depth of the second polysilicon layer is greater than a depth of the isolation regions.

In a preferred embodiment, the substrate may be doped with a P-type dopant, while the first polysilicon layer is doped with phosphorus and the second polysilicon layer is doped with arsenic.

In a preferred embodiment, the substrate may be doped with an N-type dopant, while both the first and second polysilicon layers are doped with boron and the first polysilicon layer has a higher dopant concentration than the second polysilicon layer.

A second aspect of the present invention provides a method of forming such a structure for picking up a collector region, the method including: forming two isolation regions in a substrate, the isolation regions isolating an active region therebetween; forming a trench through each of the isolation regions, each trench extending below the isolation regions, an angle between a side face of a lower portion of each trench closer to the active region and a bottom surface of the trench being smaller than 90 degrees; depositing a first polysilicon to completely fill the trenches; removing a portion of the first polysilicon in an upper portion of each trench so that the remaining first polysilicon serves as the first polysilicon layer; depositing a second polysilicon to form the second polysilicon layer in the upper portion of each trench; forming a collector region between the two isolation regions, both sides of the collector region contacting a lower portion of each trench that extends below the isolation regions, a depth of the collector region being smaller than a depth of each trench and greater than a depth of the second polysilicon layer; and forming collector electrodes contacting on the second polysilicon layer.

As indicated above, the structure of the present invention includes polysilicon stacks each consisting of a first and a second polysilicon layer stacked from the bottom up. Each first polysilicon layer has a tapered side face connected to the collector region, so that the collector region sandwiched between the first polysilicon layers has a smaller width in its lower portion than that of the conventional structure. Moreover, as dopant in the first polysilicon layers has a higher diffusivity or a higher concentration, the dopant can diffuse into the lower portion of the collector region, thus reducing the series resistance of the collector region and the saturation voltage drop of the device. Furthermore, in the structure of the present invention, the design of a lower dopant diffusivity or lower dopant concentration for the second polysilicon layers can effectively prevent the dopant therein from diffusing into an upper portion of the collector region, and thus results in a substantially unchanged dopant concentration for the collector region in its upper portion. Therefore, the structure of the present invention can achieve a substantially same Bvceo with the conventional structure and can hence also realize an "ultra-high voltage" SiGe HBT.

BRIEF DESCRIPTION OF THE DRAWINGS

FIGS. 2b to 2e show alternative embodiments of the polysilicon stacks 300 of FIG. 2a.

DETAILED DESCRIPTION

Figure 2A:
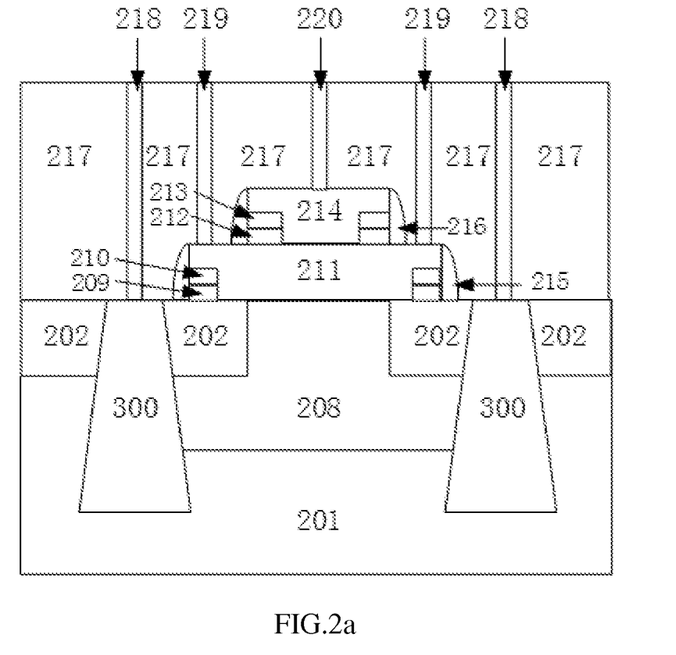
FIG. 2a schematically illustrates a vertical cross section of an ultra-high voltage SiGe HBT in accordance with embodiments of the present invention.

Referring to FIG. 2a, a structure for picking up a collector region of an ultra-high voltage SiGe HBT in accordance with embodiments of the present invention includes two polysilicon stacks 300 which are symmetrically formed in two isolation regions 202, and each of the polysilicon stacks 300 has a lower portion extending downward into a semiconductor substrate 201. The isolation regions 202 are located beneath a top surface of the substrate 201 for isolating an active region therebetween, namely the isolation regions 202 are symmetrically distributed on both sides of the active region.

Figure 2B:
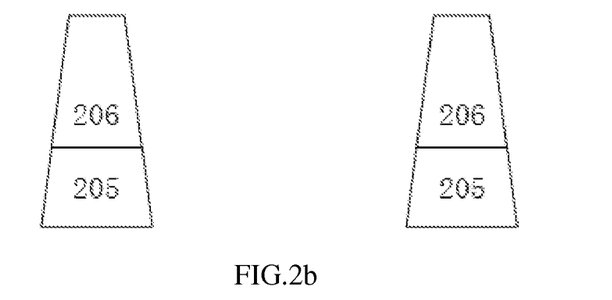
Figure 2C:
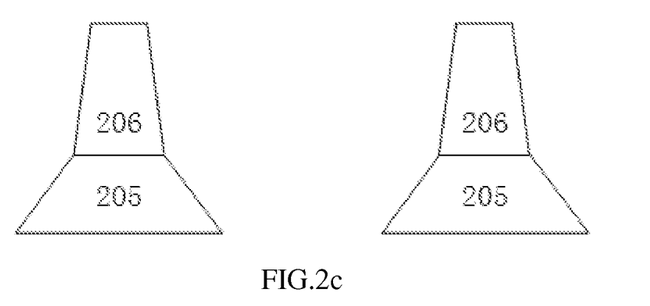
Figure 2D:
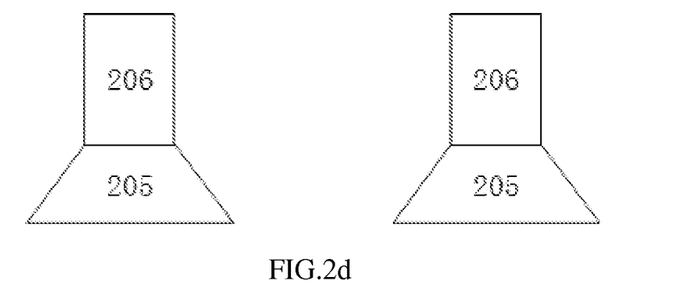
Figure 2E:
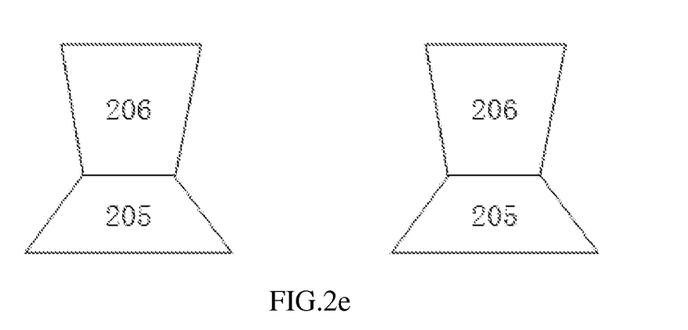

As shown in FIG. 2b, each polysilicon stack 300 comprises a first polysilicon layer 205 and a second polysilicon layer 206 that is located on and in contact with the first polysilicon layer 205. Both the first and second polysilicon layers have an opposite doping type to a conductivity type of the substrate. An acute angle is formed between a first side face (i.e., the side face that is nearer to the active region) of the first polysilicon layer 205 and a bottom surface of the first polysilicon layer 205. That is, the angle between the first side face and the bottom surface is smaller than 90 degrees. A depth of the polysilicon stacks 300 is greater than a depth of the collector region 208; the depth of the collector region 208 is greater than a depth of the second polysilicon layer 206; and the depth of the second polysilicon layer 206 is greater than a depth of the isolation regions 202. Each first polysilicon layer 205 is doped with a dopant having a higher diffusivity or higher concentration than that of any second polysilicon layer 206. The collector region 208 is located between the two isolation regions 202 and also between the two polysilicon stacks 300. The collector region 208 has a T-shaped vertical cross section. Moreover, due to being sandwiched between the isolation regions 202, an upper portion of the collector region 208 is narrower than the lower portion. In addition, both sides of the collector region 208 is in contact with a side face of a corresponding polysilicon stack 300.

The structure embodying the present invention further comprises collector electrodes 218 formed in an interlayer dielectric (ILD) layer 217. Each of the collector electrodes 218 has a bottom end that is in contact with a top end of a corresponding one of the polysilicon stack 300.

In addition to the structure described above, the ultra-high voltage SiGe HBT of FIG. 2a further comprises the conventional structures as follows: a SiGe base region 211 covering the collector region 208 as well as a portion of each isolation region 202 that is adjacent to the collector region 208, the SiGe base region 211 having a T-shaped vertical cross section; a stack of a third polysilicon layer 210 and a second dielectric layer 209 under each of two opposite extending portions of the SiGe base region 208; a polysilicon emitter region 214 on the SiGe base region 211, the polysilicon emitter region 214 also having a T-shaped vertical cross section; a stack of a fourth dielectric layer 213 and a third dielectric layer 212 under each of two opposite extending portions of the polysilicon emitter region 214; base-region sidewall spacers 215 each formed on a corresponding isolation region 202 and covering a corresponding side face of the SiGe base region 211; emitter-region sidewall spacers 216 each formed on the SiGe base region 211 and covering a corresponding side face of the polysilicon emitter region 214; the ILD layer 217 formed over all the foregoing structures; collector electrodes 218 connecting to the respective polysilicon stacks 300; base electrodes 219 connecting to the SiGe base region 211; and an emitter electrode connecting to the polysilicon emitter region 214.

Each of the isolation regions 202, the second dielectric layers 209, the third dielectric layers 212, the fourth dielectric layers 213, the base-region sidewall spacers 215, the emitter-region sidewall spacers 216 and the ILD layer 217 may be formed of one or more dielectric materials selected from the group consisting of silicon oxide, silicon nitride and silicon oxynitride.

In one embodiment of the present invention, the substrate of the SiGe HBT is doped with a P-type dopant, whilst the second polysilicon layers 206 are doped with arsenic and the first polysilicon layers 205 are doped with phosphorus which has a higher diffusivity than arsenic. In another embodiment, the substrate is doped with an N-type dopant, while both of the first polysilicon layers 205 and the second polysilicon layers 206 are doped with boron and the first polysilicon layers 205 have a higher dopant concentration than the second polysilicon layers 206.

As show in FIG. 2a, the second polysilicon layers 206 are laterally apart from the SiGe base region 211. Moreover, the farther the second polysilicon layers 206 are from the boundaries of the active region (i.e., the portion of the substrate between the two isolation regions 202), the higher a breakdown voltage the device has, and vice versa.

FIGS. 2b to 2e show alternative embodiments of the polysilicon stacks 300 of FIG. 2a. Preferably, an angle between the first side face (i.e., the side face that is nearer to the active region) and a bottom surface of the first polysilicon layer 205 is smaller than or equal to 80 degrees. More preferably, an acute angle is also formed between the second side face (i.e., the side face that is farther from the active region) of each first polysilicon layer 205 and the bottom surface of the first polysilicon layer 205. That is, a vertical cross section of each first polysilicon layer 205 has a shape of trapezoid. Moreover, a vertical cross section of each second polysilicon layer 206 may have a shape of trapezoid, rectangle, inverted trapezoid, or any other shape. Still more preferably, a first side face of each polysilicon stack 300 that is nearer to the active region is a smooth flat plane and forms an acute angle with the bottom surface of the polysilicon stack 300. More preferably, a second side face (i.e., the side face that is farther from the active region) of each polysilicon stack 300 is also a smooth flat plane and forms an acute angle with the bottom surface. That is, a vertical cross section of each polysilicon stack 300 has a shape of trapezoid as shown in FIG. 2b.

Compared with the conventional structure, the present invention is capable of reducing series resistance of a collector region of an ultra-high SiGe HBT and a saturation voltage drop of the device, while not decreasing its high breakdown voltage. Reasons are as follows.

First, as the first side face of each first polysilicon layer 205 is tapered with respect to the bottom surface, a width of the collector region 208 that is adjacent and connected to the first polysilicon layers 205 is narrower in a lower portion than a width of the conventional structure. Moreover, as dopant in the first polysilicon layers 205 has a higher diffusivity or a higher concentration, it can laterally diffuse into the lower portion of the collector region 208, thus reducing the series resistance of the collector region 208 as well as the saturation voltage drop of the device.

Second, the design of a lower dopant diffusivity or lower dopant concentration for the second polysilicon layers 206 can effectively prevent the dopant therein from diffusing into an upper portion of the collector region 208, and thus results in a substantially unchanged dopant concentration for the collector region 208 in its upper portion. Therefore, the structure of the present invention can achieve a substantially same breakdown voltage in common-emitter configuration, Bvceo, with the conventional structure.

For the ultra-high SiGe HBT of the conventional structure shown in FIG. 1, if it is assumed that: the collector region 104 has a dopant concentration of $1 \times 10^{16}$ atoms/cm$^3$ and a resistivity of 0.5 ohm·cm; the pseudo buried layers 103 have a dopant concentration of $1 \times 10^{20}$ atoms/cm$^3$ and a resistivity of $7.6 \times 10^{-4}$ ohm·cm; the collector region 104 has a depth of 1 μm and a width of 2 μm; and the collector region 104 is uniformly doped, then resistance of the heavily-doped pseudo buried layers 103 can be omitted when compared to that of the lightly-doped collector region 104.

In one specific embodiment of the present invention, the collector region 208 has the same dopant concentration and resistivity with the collector region 104 described above, and the first polysilicon layers 205 have the same dopant concentration and resistivity with the pseudo buried layers 103. Moreover, each polysilicon stack 300 has a depth of 3 μm. The first side face of each first polysilicon layer 205 forms an angle of 80 degrees with its bottom surface. Compared to the conventional device (shown in FIG. 1), the spacing between the two first polysilicon layers 205 at their bottoms is 1.06 μm smaller than the spacing between the pseudo buried layers 103. According to a rough estimation, this resulted in a reduction of series resistance by half for the collector region 208 and thus greatly reduced the saturation voltage drop of the ultra-high voltage SiGe HBT of this embodiment.

Figure 3A:
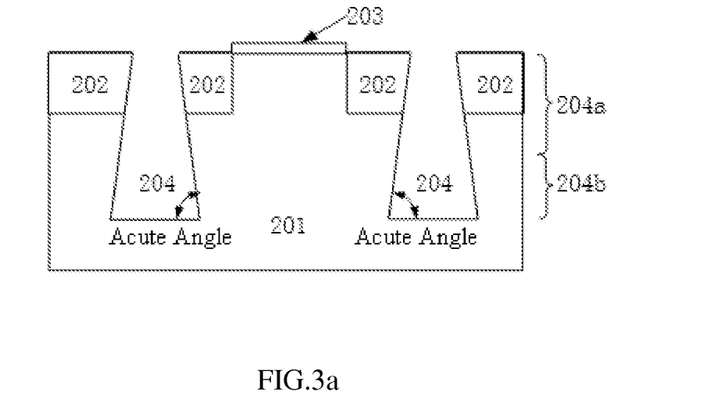
FIGS. 3a to 3k schematically illustrate device structures after steps of a method of manufacturing an ultra-high voltage SiGe HBT in accordance with the present invention.

An ultra-high voltage SiGe HBT incorporating a structure for picking up a collector region embodying the present invention may be fabricated by the following method:

In a first step, as shown in FIG. 3a, two isolation regions 202 are formed in a semiconductor substrate 201 using, for example, a local oxidation of silicon (LOCOS) process or shallow trench isolation (STI) process. The semiconductor substrate 201 may be, for example, a P-type silicon substrate.

Next, a first dielectric layer 203 serving as a temporary protective layer for an active region is formed over the surface of the substrate 201 using, for example, a thermal oxidation growth process (only can be used in the case that the first dielectric layer 203 is formed of silicon oxide), a deposition process, or a photolithography and etching process.

After that, a trench 204 is etched in each isolation region 202, the trench extending into the underlying semiconductor substrate. Each trench comprises two portions, an upper portion 204a and a lower portion 204b. A first side face of each lower portion 204b that is closer to the active region forms an acute angle with a bottom surface of the lower portion 204b. Preferably, the angle between the first side face and the bottom surface is smaller than or equal to 80 degrees. More preferably, a second side face (i.e., the side face that is farther from the active region) of each lower portion 204b also forms an acute angle with the bottom surface. That is, a vertical cross section of each lower portion 204b has a shape of trapezoid. Moreover, in order to facilitate the filling of polysilicon into the trenches 204 and to increase the breakdown voltage of the resulting device, a vertical cross section of each upper portion 204a may have a shape of trapezoid, rectangle, inverted trapezoid, or any other shape.

Still more preferably, a first side face of each trench 204 that is nearer to the active region is a smooth flat plane and forms an acute angle with the bottom surface of the trench 204. Still yet more preferably, a second side face (i.e., the side face that is farther from the active region) of each trench 204 is also a smooth flat plane as a whole and forms an acute angle with the bottom surface. That is, a vertical cross section of each trench 204 has a shape of trapezoid.

Further, provided that it has been ensured that polysilicon can be well enough filled into the trenches 204, it is preferred to increase the inclination of the first side face of each lower portion 204b (more preferably, the first side face of each trench 204 as a whole) that is nearer to the active region, i.e., to reduce the angle between the first side face and the bottom surface, as much as possible.

Figure 3B:
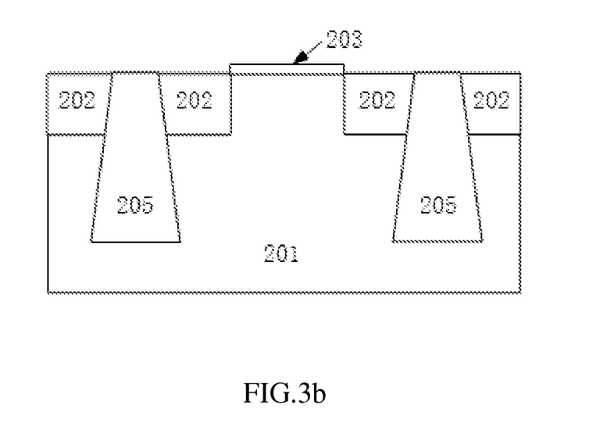

In a second step, as shown in FIG. 3b, first polysilicon is deposited over the silicon substrate using, for example, a chemical vapor deposition (CVD) process. The first polysilicon at least completely fills the trenches 204. Moreover, the first polysilicon is in-situ doped concurrently with, or alternatively doped by ion implantation after, its deposition, with a dopant that has an opposite conductivity type to the substrate 201. In one embodiment, the substrate 201 is doped with a P-type dopant, while the first polysilicon is doped with an N-type dopant, preferably, phosphorus. In another embodiment, the substrate 201 is doped with an N-type dopant, while the first polysilicon is doped with a P-type dopant, preferably, boron.

After that, the first polysilicon is planarized using, for example, a chemical-mechanical polishing (CMP) process, to remove its portions that are deposited above the isolation regions 202 and the first dielectric layer 203, respectively. The remaining first polysilicon are completely filled in the trenches 204.

Figure 3C:
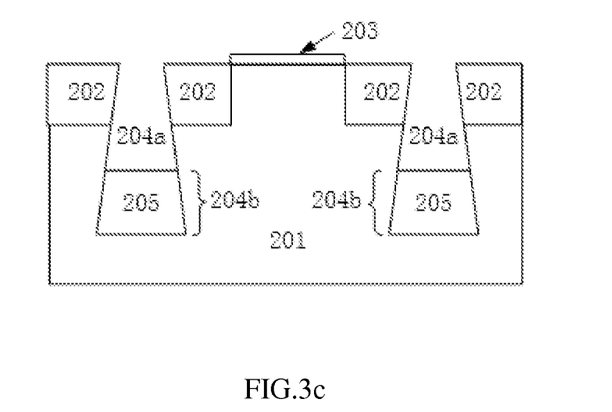

In a third step, as shown in FIG. 3c, dry etch-back process is performed to remove portions of the first polysilicon that are deposited in the upper portions 204a of the trenches 204, so that the upper portions 204a are emptied and each upper portion 204a has a depth that is greater than a depth of any isolation region 202. The remaining first polysilicon serves as the first polysilicon layer 205.

Figure 3D:
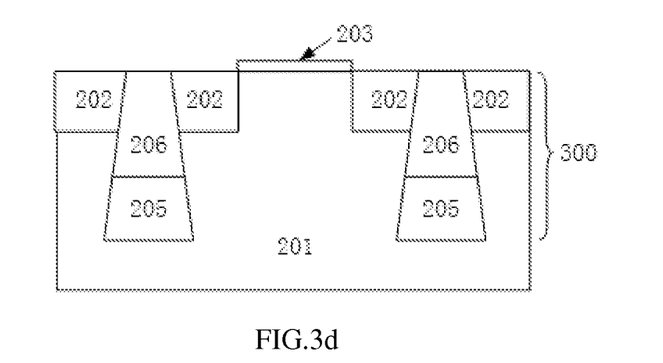

In a fourth step, as shown in FIG. 3d, second polysilicon is deposited over the resulting structure, at least completely filling the upper portions 204a. Moreover, the second polysilicon is in-situ doped concurrently with, or alternatively doped by ion implantation after, its deposition, with a dopant that has an opposite conductivity type to the substrate 201. In one embodiment, the substrate 201 is doped with a P-type dopant, while the second polysilicon is doped with an N-type dopant, preferably, arsenic which has a low diffusivity than phosphorus. In another embodiment, the substrate 201 is doped with an N-type dopant, while the second polysilicon 206 is doped with a P-type dopant, preferably, boron. In addition, dopant concentration of the second polysilicon is lower than that of the first polysilicon 205.

Next, the second polysilicon is planarized to remove its portions that are deposited above the isolation regions 202 and the first dielectric layer 203, respectively. The remaining portions of the second polysilicon completely fill the upper portions 204a of the trenches 204, and each of which serves as a second polysilicon layer 206. In each trench 204, a first polysilicon 205 and a second polysilicon 206 comprise a polysilicon stack 300.

Figure 3E:
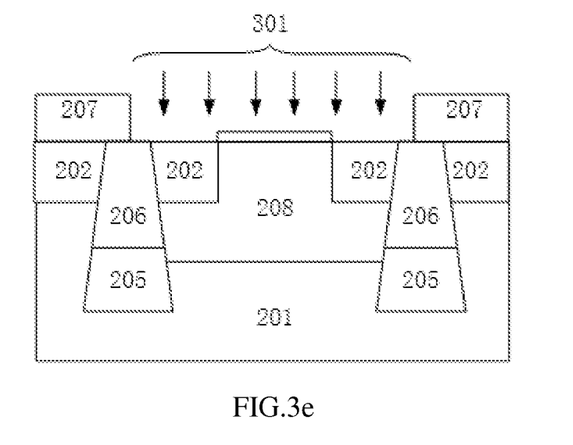

In a fifth step, as shown in FIG. 3e, a photolithography process is performed to remove a portion of a first photoresist layer 207 to expose an underlying area 301 on which a collector region described below is to be formed. The area 301 covers a portion of the substrate between the two trenches 204 and selectively covers the trenches 204 as well.

After that, ions are implanted through the area 301 to form a lightly-doped collector region 208 in the portion of the substrate between the trenches 204. The ions may have an opposite conductivity type to the dopant in the substrate 201. In one embodiment, the substrate 201 is doped with a P-type dopant, while N-type ions are doped through the area 301 to form an N-type doped collector region 208. The collector region 208 has a T-shaped vertical cross section and in contact with, on both sides, a side face of one of the polysilicon stacks 300. Moreover, a depth of the collector region 208 is smaller than a depth of any trench 204 and greater than a depth of the upper portion 204a of any trench 204.

Figure 3F:
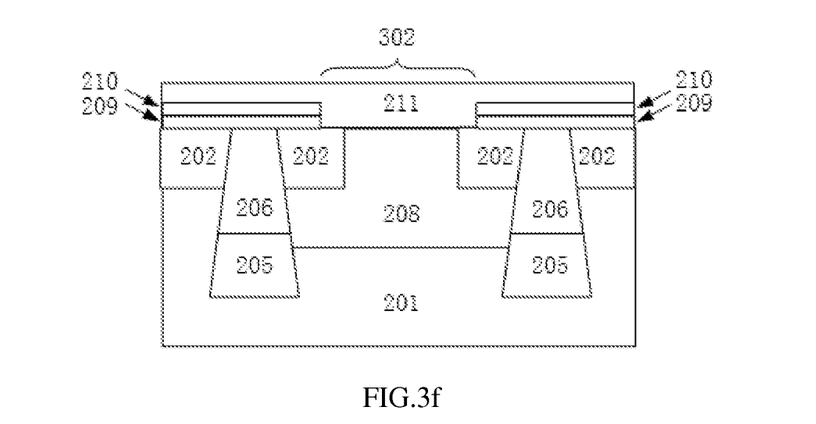

In a sixth step, as shown in FIG. 3f, the first photoresist layer 207 is removed, and a second dielectric layer 209 and a third polysilicon layer 210, for jointly forming stacks under respective opposite extending portions of a T-shaped base region described blow, are deposited over the resulting structure in this order.

Next, a base window 302 is opened in a second photoresist layer (not shown) using a photolithography process. The base window 302 totally covers the collector region 208 as well as portions of the isolation regions 202 that are adjacent to the collector region 208.

After that, an etching process is adopted to remove a portion, which is right under the base window 302, of each of the third polysilicon layer 210, the second dielectric layer 209 and the first dielectric layer 203. In this step, as the first dielectric layer 203 is entirely located under the area of the base window 302, it is completely removed.

Thereafter, a SiGe layer 211 is formed over the resulting structure, at least completely filling the base window 302. Next, the top surface of the SiGe layer 211 is planarized using a polishing process.

Figure 3G:
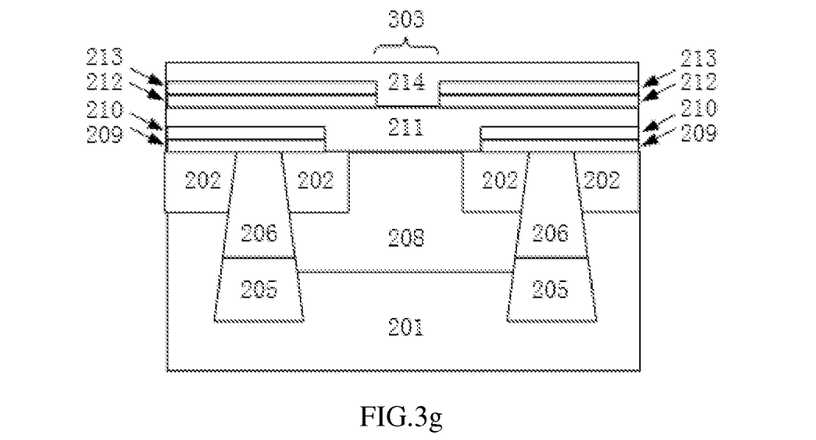

In a seventh step, as shown in FIG. 3g, a third dielectric layer 212 and a fourth dielectric layer 213, for jointly forming stacks under respective opposite extending portions of a T-shaped emitter region described blow, are deposited over the resulting structure in this order.

Next, an emitter window 303 is opened in a third photoresist layer (not shown) using a photolithography process. The emitter window 303 partially covers the collector region 208.

After that, an etching process is adopted to remove a portion, which is right below the emitter window 303, of each of the fourth dielectric layer 213 and the third dielectric layer 212.

Thereafter, fourth polysilicon 214 for forming the emitter region is deposited over the resulting structure, at least completely filling the emitter window 303. Next, the top surface of the fourth polysilicon 214 is planarized using a polishing process.

Next, the fourth polysilicon 214 is doped by ion implantation with a dopant having an opposite conductivity type to that of the substrate 201.

Figure 3H:
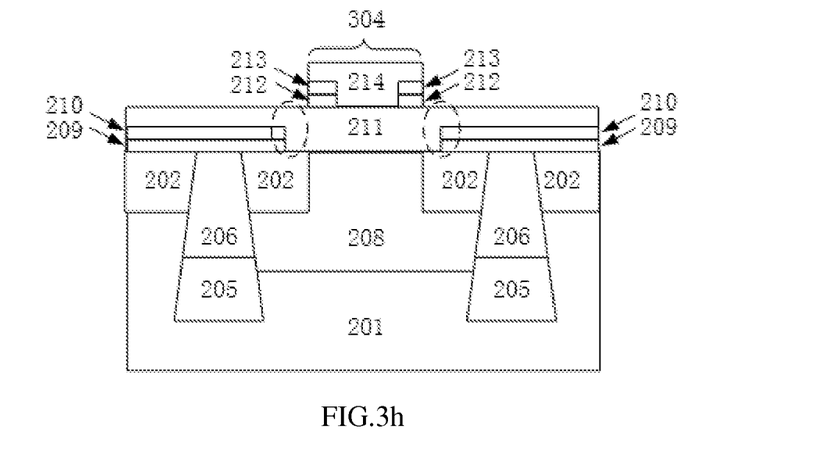

In an eighth step, as shown in FIG. 3h, other than a portion 304 under which the emitter region is to be formed, the rest portion of a fourth photoresist (not shown) is removed using a photolithography process. The portion 304 is just right above the entire area of the collector region 208.

Next, for each of the fourth polysilicon 214, the fourth dielectric layer 213 and the third dielectric layer 212, other than a portion right below the photoresist portion 304, the rest portion is removed using an etching process. Thereafter, the remaining portion of the fourth polysilicon 214 has a T-shaped vertical cross section and serves as the polysilicon emitter region 214. In addition, under each extending portion of the polysilicon emitter region 214, there appears a stack comprising remaining portions of the fourth dielectric layer 213 and the third dielectric layer 212.

After that, portions of the SiGe layer 211 that are horizontally apart from the polysilicon emitter region 214 (i.e., potions indicated by the dashed boxes in FIG. 3h, where extrinsic base regions are to be formed) is doped by ion implantation with a dopant having the same conductivity type to that of the substrate 201.

Figure 3I:
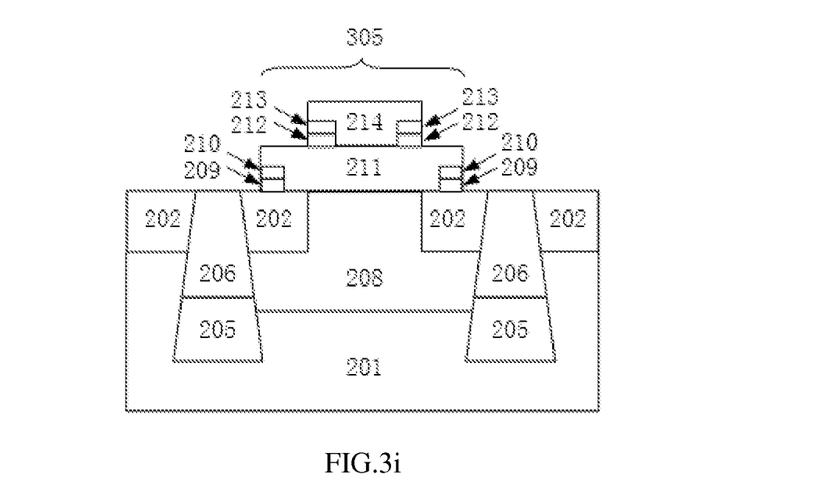

In a ninth step, as shown in FIG. 3i, other than a portion 305 under which the base region is to be formed, the rest portion of a fifth photoresist (not shown) is removed using a photolithography process. The portion 305 is just right above an area covering the entire collector region 208 as well as a portion of each isolation region 202 that is adjacent to the collector region 208.

Next, for each of the SiGe layer 211, the third polysilicon layer 210 and the second dielectric layer 209, other than a portion right below the photoresist portion 305, the rest portion is removed using an etching process. Thereafter, the remaining portion of the SiGe layer 211 has a T-shaped vertical cross section and serves as the SiGe base region 211. In addition, under each extending portion of the SiGe base region 211, there is present a stack comprising remaining portions of the third polysilicon layer 210 and the second dielectric layer 209.

Figure 3J:
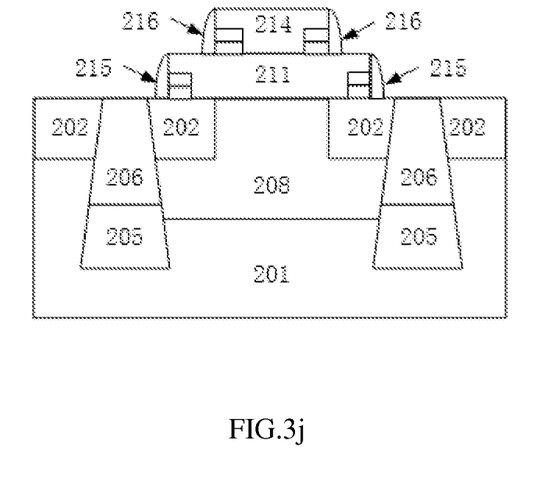

In a tenth step, as shown in FIG. 3j, a fifth dielectric layer is deposited over the resulting structure, and thereafter is etched using an etch-back process to form base-region sidewall spacers 215, each of which covers a side face of the SiGe base region 211, and emitter-region sidewall spacers 216, each of which covers a side face of the polysilicon emitter region 214.

Figure 3K:
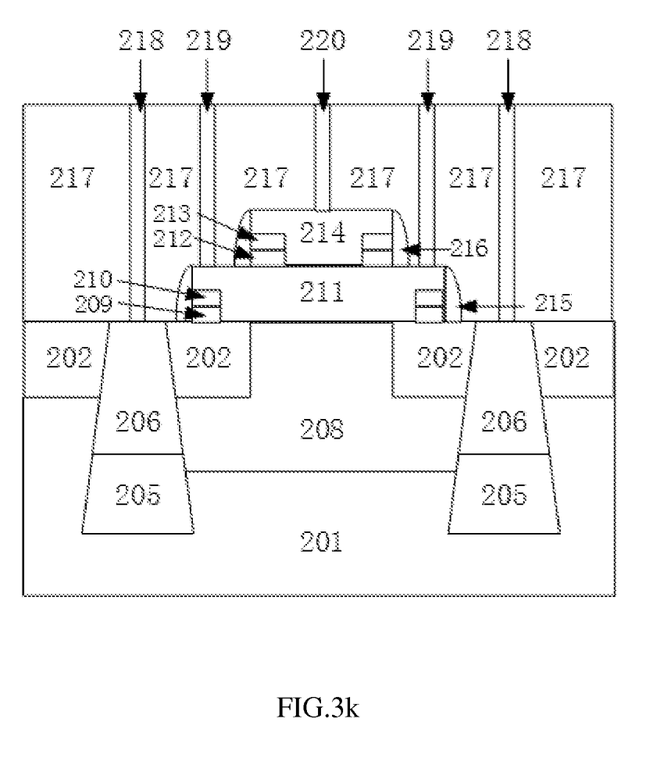

In an eleventh step, as shown in FIG. 3k, an ILD layer 217 is deposited over the resulting structure. The ILD layer 217 may be formed of borophosphosilicate glass (BPSG).

Next, a plurality of through-holes are formed in the ILD layer 217 using photolithography and etching processes, including first through-holes each having a bottom end connecting to a corresponding second polysilicon layer 206, second through-holes each having a bottom end connecting to the SiGe base region 211, and a third through-hole having a bottom end connecting to the polysilicon emitter region 214.

After that, these through-holes are filled with conductive materials and thereafter are planarized to form collector electrodes 218, base electrodes 219 and an emitter electrode 220. This can be realized by using, for example, a tungsten plug process.

In this method, a width of the area 301 (referring to FIG. 3e)>a width of the portion 305 (referring to FIG. 3i)>a width of the base window 302 (referring to FIG. 3f)>a width of the portion 304 (referring to FIG. 3h, the width of which is substantially equal to a width of the collector region 208 at the upper edges thereof)>a width of the emitter window 303 (referring to FIG. 3g).

In the second step, the first polysilicon 205 is preferably in-situ doped, or is alternatively doped by ion implantation after it has been deposited. In addition, in order to ensure a reduced series resistance for the collector region 208 and a reduced saturation voltage drop for the resulting device, the first polysilicon 205 preferably has a dopant concentration that is higher than $1 \times 10^{20}$ atoms/cm$^3$. Moreover, in the fourth step, the second polysilicon 206 is also preferably in-situ doped, or is alternatively doped by ion implantation after it has been deposited. Additionally, the second polysilicon 206 is preferably doped at a dose of higher than $1 \times 10^{15}$ atoms/cm$^2$ and with an energy that can enable the fully doping of the second polysilicon layers 206 that are formed in the upper portions 204a of the trenches 204. Furthermore, in the seventh step, the fourth polysilicon 214 may be formed by in-situ doped process instead of by ion implantation process after the deposition.

In this SiGe HBT manufacturing method, the first to fifth steps as well as the eleventh step comprise a method of manufacturing a structure for picking up a collector region according to the present invention.

While specific embodiments have been presented in the foregoing description of the invention, they are not intended to limit the invention in any way. Those skilled in the art can make various modifications and variations without departing from the scope of the invention. Thus, it is intended that the present invention covers all such modifications and variations, as well as equivalents thereof.

What is claimed is:

1. A structure for picking up a collector region, the collector region being formed in a substrate and sandwiched between two isolation regions, the structure comprising:
   a pair of polysilicon stacks formed in the isolation regions and extending below the collector region; and
   a pair of collector electrodes contacting on the polysilicon stacks,
   wherein the pair of polysilicon stacks comprising:
   a first polysilicon layer located below the isolation regions, the first polysilicon layer having a first side face contacting with the collector region, an angle between the first side face and a bottom surface of the first polysilicon layer being smaller than 90 degrees; and
   a second polysilicon layer located on and in contact with the first polysilicon layer,
   wherein both the first and second polysilicon layers have an opposite conductivity type to a conductivity type of the substrate,
   wherein the first polysilicon layer is doped with a dopant having either a higher diffusivity or a higher concentration than a dopant of the second polysilicon layer, and
   wherein a depth of the polysilicon stacks is greater than a depth of the collector region; the depth of the collector region is greater than a depth of the second polysilicon layer; and the depth of the second polysilicon layer is greater than a depth of the isolation regions.

2. The structure according to claim 1, wherein the substrate is doped with a P-type dopant; the first polysilicon layer is doped with phosphorus, and the second polysilicon layer is doped with arsenic.

3. The structure according to claim 1, wherein the substrate is doped with an N-type dopant; the first and second polysilicon layers are both doped with boron, and a dopant concentration of the first polysilicon layer is higher than a dopant concentration of the second polysilicon layer.

4. The structure according to claim 1, wherein an angle between the first side face and the bottom surface of the first polysilicon layer is smaller than or equal to 80 degrees.

5. The structure according to claim 1, wherein an angle between a second side face and the bottom surface of the first polysilicon layer is smaller than 90 degrees.

6. The structure according to claim 1, wherein a first side face of the polysilicon stack is a smooth flat plane.

7. The structure according to claim 1, wherein a vertical cross section of the second polysilicon layer has a shape of trapezoid, rectangle, inverted trapezoid, or the like.

8. A method of manufacturing the structure for picking up a collector region according to claim 1, the method comprising:
   forming two isolation regions in a substrate, the isolation regions isolating an active region therebetween;

forming a trench through each of the isolation regions, each trench extending below the isolation regions, an angle between a side face of a lower portion of each trench closer to the active region and a bottom surface of the trench being smaller than 90 degrees;

depositing a first polysilicon to completely fill the trenches;

removing a portion of the first polysilicon in an upper portion of each trench so that the remaining first polysilicon serves as the first polysilicon layer;

depositing a second polysilicon to form the second polysilicon layer in the upper portion of each trench;

forming a collector region between the two isolation regions, both sides of the collector region contacting a lower portion of each trench that extends below the isolation regions, a depth of the collector region being smaller than a depth of each trench and greater than a depth of the second polysilicon layer; and forming collector electrodes contacting on the second polysilicon layer.

9. The method according to claim 8, wherein an angle between the side face of a lower portion of each trench closer to the active region and the bottom surface of the trench is smaller than or equal to 80 degrees.

10. The method according to claim 8, wherein the first polysilicon is in-situ doped with a dopant that has an opposite conductivity type to the substrate during the process of depositing the first polysilicon.

11. The method according to claim 8, wherein the first polysilicon is doped by ion implantation with a dopant that has an opposite conductivity type to the substrate after the first polysilicon is deposited.

12. The method according to claim 8, wherein the second polysilicon is in-situ doped with a dopant that has an opposite conductivity type to the substrate during the process of depositing the first polysilicon.

13. The method according to claim 8, wherein the second polysilicon is doped by ion implantation with a dopant that has an opposite conductivity type to the substrate after the second polysilicon is deposited.

14. The method according to claim 8, wherein the substrate is doped with a P-type dopant; the first polysilicon layer is doped with phosphorus, and the second polysilicon layer is doped with arsenic.

15. The method according to claim 8, wherein the substrate is doped with an N-type dopant; the first and second polysilicon layer are both doped with boron, and a dopant concentration of the first polysilicon layer is higher than a dopant concentration of the second polysilicon layer.

\* \* \* \* \*